United States Patent
Jeong et al.

(10) Patent No.: US 10,396,123 B2
(45) Date of Patent: Aug. 27, 2019

(54) TEMPLATING LAYERS FOR PERPENDICULARLY MAGNETIZED HEUSLER FILMS

(71) Applicants: INTERNATIONAL BUSINESS MACHINES CORPORATION, Armonk, NY (US); SAMSUNG ELECTRONICS CO., LTD., Suwon-si, Gyeonggi-Do (KR)

(72) Inventors: Jaewoo Jeong, San Jose, CA (US); Stuart S. P. Parkin, San Jose, CA (US); Mahesh G. Samant, San Jose, CA (US)

(73) Assignees: International Business Machines Corporation, Armonk, NY (US); Samsung Electronics Co., Ltd, Suwon-Si (KR)

( * ) Notice: Subject to any disclaimer, the term of this patent is extended or adjusted under 35 U.S.C. 154(b) by 4 days.

(21) Appl. No.: 15/660,681

(22) Filed: Jul. 26, 2017

(65) Prior Publication Data

US 2019/0035849 A1 Jan. 31, 2019

(51) Int. Cl.

| | |
|---|---|
| *G11C 11/00* | (2006.01) |
| *H01L 27/22* | (2006.01) |
| *H01F 10/16* | (2006.01) |
| *H01F 10/32* | (2006.01) |
| *H01L 43/10* | (2006.01) |

(Continued)

(52) U.S. Cl.
CPC ............ *H01L 27/222* (2013.01); *B32B 15/04* (2013.01); *C22C 21/00* (2013.01); *C22C 22/00* (2013.01); *G11C 11/161* (2013.01); *H01F 10/16* (2013.01); *H01F 10/329* (2013.01); *H01F 10/3286* (2013.01); *H01L 43/02* (2013.01); *H01L 43/10* (2013.01); *H01L 43/12* (2013.01); *B32B 2457/00* (2013.01); *C22C 2202/02* (2013.01)

(58) Field of Classification Search
CPC ....... H01L 27/222; H01L 43/02; H01L 43/10; H01L 43/12; H01F 10/16; H01F 10/3286; H01F 10/329; G11C 11/161; C22C 21/00; C22C 22/00; B32B 15/04
See application file for complete search history.

(56) References Cited

U.S. PATENT DOCUMENTS

| | | |
|---|---|---|
| 6,834,005 B1 | 12/2004 | Parkin |
| 7,268,984 B2 | 9/2007 | Hasegawa et al. |

(Continued)

*Primary Examiner* — Toan K Le
(74) *Attorney, Agent, or Firm* — Daniel E. Johnson (57) ABSTRACT

Devices are described that include a multi-layered structure that is non-magnetic at room temperature, and which comprises alternating layers of Co and at least one other element E (that is preferably Al; or Al alloyed with Ga, Ge, Sn or combinations thereof). The composition of this structure is represented by $Co_{1-x}E_x$, with x being in the range from 0.45 to 0.55. The structure is in contact with a first magnetic layer that includes a Heusler compound. An MRAM element may be formed by overlying, in turn, the first magnetic layer with a tunnel barrier, and the tunnel barrier with a second magnetic layer (whose magnetic moment is switchable). Improved performance of the MRAM element may be obtained by placing an optional pinning layer between the first magnetic layer and the tunnel barrier.

29 Claims, 11 Drawing Sheets

(51) Int. Cl.
*H01L 43/12* (2006.01)
*H01L 43/02* (2006.01)
*G11C 11/16* (2006.01)
*C22C 21/00* (2006.01)
*C22C 22/00* (2006.01)
*B32B 15/04* (2006.01)

(56) References Cited

U.S. PATENT DOCUMENTS

| | | | |
|---|---|---|---|
| 7,558,028 B2 | 7/2009 | Carey et al. | |
| 7,672,088 B2 | 3/2010 | Zhang et al. | |
| 8,064,244 B2 | 11/2011 | Zhang et al. | |
| 8,526,224 B2 | 9/2013 | Clinton et al. | |
| 8,796,797 B2 | 8/2014 | Doyle et al. | |
| 8,853,663 B2 * | 10/2014 | Sumino | G11C 13/0002 257/1 |
| 9,005,997 B2 | 4/2015 | Bang et al. | |
| 9,336,937 B2 * | 5/2016 | Takahashi | C22C 19/07 |
| 9,406,365 B1 * | 8/2016 | Jeong | G11C 11/161 |
| 9,643,385 B1 * | 5/2017 | Butler | B32B 15/01 |
| 9,666,215 B2 * | 5/2017 | Faleev | G11B 5/3909 |
| 2006/0044703 A1 * | 3/2006 | Inomata | G11B 5/3903 360/324.1 |
| 2009/0015969 A1 * | 1/2009 | Kainuma | B82Y 10/00 360/314 |
| 2009/0050948 A1 * | 2/2009 | Ishikawa | B82Y 25/00 257/295 |
| 2011/0149647 A1 | 6/2011 | Kim et al. | |
| 2014/0340183 A1 * | 11/2014 | Nakada | H01L 43/02 336/30 |
| 2015/0162378 A1 * | 6/2015 | Carey | H01L 43/02 257/421 |
| 2016/0380185 A1 | 12/2016 | Kato et al. | |
| 2017/0229643 A1 * | 8/2017 | Chen | H01F 10/16 |
| 2018/0006213 A1 * | 1/2018 | Park | H01L 43/02 |
| 2018/0205008 A1 * | 7/2018 | Jeong | H01L 43/10 |
| 2018/0254409 A1 * | 9/2018 | Nakada | H01L 43/10 |

* cited by examiner

TEMPLATING LAYERS FOR PERPENDICULARLY MAGNETIZED HEUSLER FILMS

PARTIES TO A JOINT DEVELOPMENT AGREEMENT

This invention was made under a joint development agreement between International Business Machines Corporation and Samsung Electronics Co., Ltd.

TECHNICAL FIELD

The invention is in the field of magnetic random access memory (MRAM), and more particularly, MRAM devices that rely on spin transfer torque.

BACKGROUND

Heusler compounds are a class of materials having the representative formula $X_2YZ$, where X and Y are transition metals or lanthanides, and Z is from a main group element. Due to the chemical distinction between X or Y and Z, they form a unique structure defined by the space group symmetry $L2_1$ (or $D0_{22}$ when they are tetragonally distorted), where four face-centered cubic structures penetrate each other. The properties of Heusler compounds are strongly dependent on the chemical ordering of the elements constituting the compounds. Thus, the fabrication of high quality Heusler films typically requires high temperature thermal processes: for example, deposition at temperatures significantly above room temperature and/or thermal annealing at high temperatures (400° C. or higher).

SUMMARY

Disclosed herein are highly textured, very smooth, high quality ultrathin films of Heusler compounds, which can be fabricated without a thermal annealing process, using a non-magnetic templating layer. The templating layer is preferably formed from a binary alloy of Co—Al with the B2 structure, the cubic version of $L1_0$. The templating layer can be deposited at room temperature and is chemically ordered (i.e., the formation of alternating atomic layers of Co and Al), even in the as-deposited state. We find that ultrathin films of Heusler compounds deposited on these templating layers are highly epitaxial, chemically ordered, high quality films with excellent magnetic properties, including especially high values of perpendicular magnetic anisotropy and square magnetic hysteresis loops (with the remanent moment in zero magnetic field being close to the saturation moment). We attribute this to the similarity between the B2 symmetry of the templating layer and the $L2_1$ or $D0_{22}$ symmetry of the Heusler layer.

The most important characteristic of the underlayer is that it is composed of elements that are similar to those of the Heusler compound. For example, any intermixing or diffusion of the Al from the CoAl underlayers into the Heusler layer does not significantly change the properties of the Heusler layer, since Al is from the class of Z elements from which the Heuslers are formed. Similarly, underlayers that partially replace Al with other Z elements, such as Ga, Ge and/or Sn, are suitable for the underlayers. The Co within the CoAl underlayers can also diffuse into the Heusler without causing significant degradation of the magnetic properties of the Heusler layer, as discussed below. Thus the underlayers can be formed from X'-Z' alloys, where X' is a transition metal and Z' is a main group element.

Figure 1:
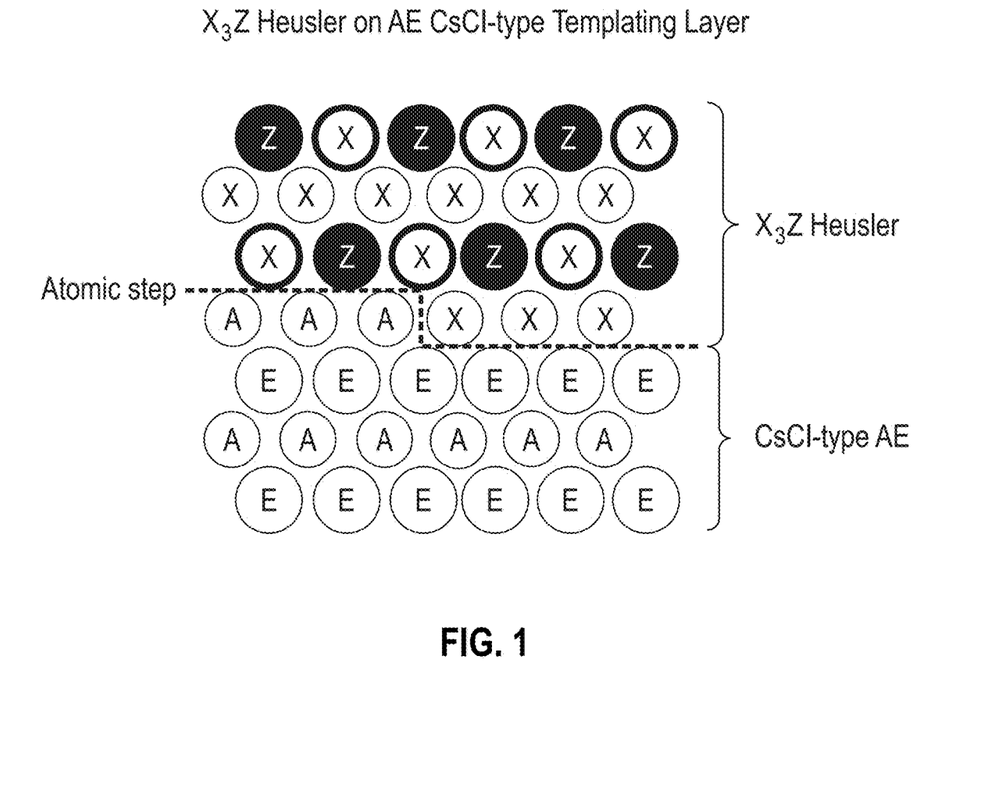
FIG. 1. Illustration of the atomic templating concept. A and X represent transition metal elements, and E and Z represent main group elements.

Another important property of the underlayer is that it can promote chemical ordering of the Heusler compound. The underlayer will inevitably have terraces with atomic steps between neighboring terraces which separates a terrace with a surface formed from Co with a terrace formed from Al. Due to the chemical affinity of X (or Y) to Al, and of Z to Co, the underlayer promotes the chemical ordering of the Heusler compound at modest temperatures even as low as room temperature, as illustrated in FIG. 1. Annealing does not significantly improve the magnetic properties of the Heusler compound.

One embodiment of the invention is a device that includes a multi-layered structure that is non-magnetic at room temperature, with the structure comprising alternating layers of Co and E, wherein E comprises at least one other element that includes Al; the composition of the structure can be represented by $Co_{1-x}E_x$ with x being in the range from 0.45 to 0.55. The device also includes a first magnetic layer that includes a Heusler compound, with the magnetic layer being in contact with the structure. This magnetic layer may advantageously have a thickness of less than 5 nm, or even less than 3 nm, or as little as the thickness of a single unit cell (e.g., 0.7-0.8 nm). In some preferred embodiments, the Heusler compound is selected from the group consisting of $Mn_{3.1-x}Ge$, $Mn_{3.1-x}Sn$, and $Mn_{3.1-x}Sb$, with x being in the range from 0 to 1.1. Alternatively, the Heusler compound may be a ternary Heusler, such as $Mn_{3.1-x}Co_{1.1-y}Sn$, wherein $x \leq 1.2$ and $y \leq 1.0$. The device may form part of an MRAM element, in which case a tunnel barrier (such as MgO) is in contact with the magnetic layer, and a second magnetic layer is in contact with the tunnel barrier.

Figure 8:
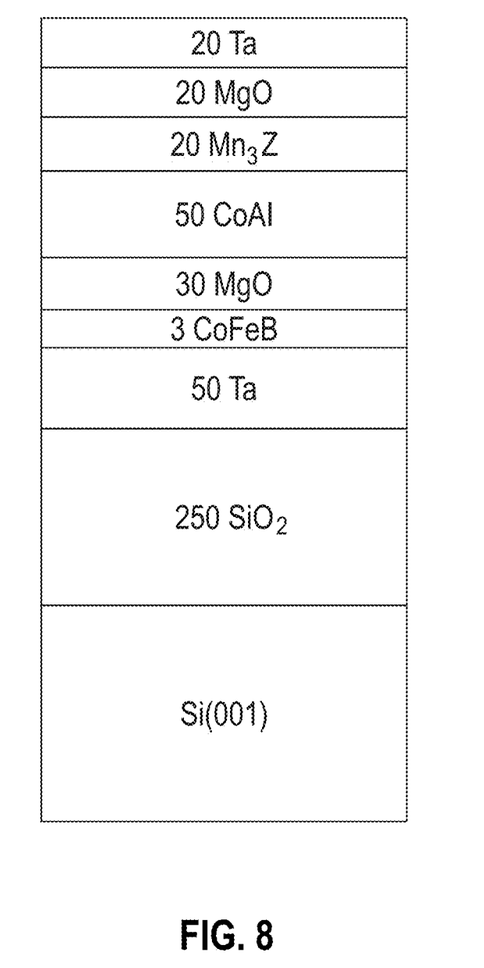
FIG. 8. Material stack for 20 Å thick $Mn_3Z$ Heusler films (Z=Ge, Sn, and Sb) grown on an amorphous substrate (Si(001)/250 Å $SiO_2$). All thicknesses are in Å.

The device may be formed by depositing Co and Al (or alternatively an Al alloy) over one or more underlying layers), thereby forming a composite layer; annealing the composite layer, so that at least one layer of Co and at least one layer of Al (or the Al alloy) are formed from the composite layer, thereby forming the multi-layered structure; and then depositing the magnetic layer over the multi-layered structure. The underlying layer or layers (e.g., MgO, as shown in FIG. 8; or MgO/Cr) preferably have a crystal orientation of (001), as do all the MgO layers described herein.

Another embodiment of the invention is a device that includes a substrate and a multi-layered structure that overlies the substrate. The multi-layered structure is non-magnetic at room temperature and comprises alternating layers of Co and E, wherein E comprises at least one other element that includes Al, in which the composition of the structure is represented by $Co_{1-x}E_x$, with x being in the range from 0.45 to 0.55. The device also includes a first magnetic layer in contact with the structure, a tunnel barrier overlying the first magnetic layer, and a second magnetic layer in contact with the tunnel barrier. The first magnetic layer includes a Heusler compound, and the second magnetic layer is in contact with the tunnel barrier and has a magnetic moment that is switchable. Furthermore, a capping layer is in contact with the second magnetic layer. The first magnetic layer includes Mn and an element selected from the group consisting of Sn, Sb, and Ge.

Yet another embodiment of the invention is a device that includes a multi-layered structure that is non-magnetic at room temperature, in which the structure comprises alternating layers of Co and E, with E comprising at least one other element that includes Al; the composition of the structure is represented by $Co_{1-x}E_x$ with x being in the range from 0.45 to 0.55. The device also includes a first magnetic layer that includes an $L1_0$ compound, with the magnetic layer being in contact with the structure.

DETAILED DESCRIPTION

New magnetic materials are needed to allow for scaling of STT-MRAM (spin transfer torque-magnetic random access memories) beyond the 20 nm node. These materials must have very large perpendicular magnetic anisotropy (PMA) and, for integration purposes, be compatible with conventional CMOS technologies. Such magnetic materials form electrodes of magnetic tunnel junction (MTJ) based memory elements. An important mechanism for switching the state of the MTJ element is using spin polarized tunneling currents that are passed through the MTJ. The magnitude of this current is limited by the size of the transistors used to provide the write current. This means that the thickness of the electrode must be sufficiently small that it can be switched by the available current. For magnetization values of ~1000 emu/cm$^3$, the electrode must have a thickness that does not exceed approximately 1 nm. The thickness of electrodes formed from Heusler alloys, to date, far exceeds this value in all cases. The thinnest layers to date are for the Heusler compound $Mn_3Ge$, for which layers as thin as 5 nm showed perpendicular magnetic anisotropy and reasonably square magnetic hysteresis loops. The magnetic hysteresis loops for thinner layers showed poor squareness and are much less suitable for STT-MRAM.

CoAl Chemical Templating Layer

Single crystal epitaxial films of $Co_{1-x}Al_x$ alloy were grown by dc-magnetron sputtering onto MgO buffer layers overlying MgO(001) single crystal substrates, in an ultra-high vacuum (UHV) chamber with a base pressure of $\sim 2 \times 10^{-9}$ Torr. The MgO buffer layer was prepared by depositing 20 Å thick MgO at room temperature using ion-beam deposition (IBD) from a MgO target. Films of 300 Å thick CoAl were deposited at room temperature and annealed at various temperatures $T_{AN}$=200, 300, 400, and 500° C. for 30 minutes. The composition of the CoAl layers was determined to be $Co_{51}Al_{49}$ by Rutherford backscattering measurement.

Figure 2:
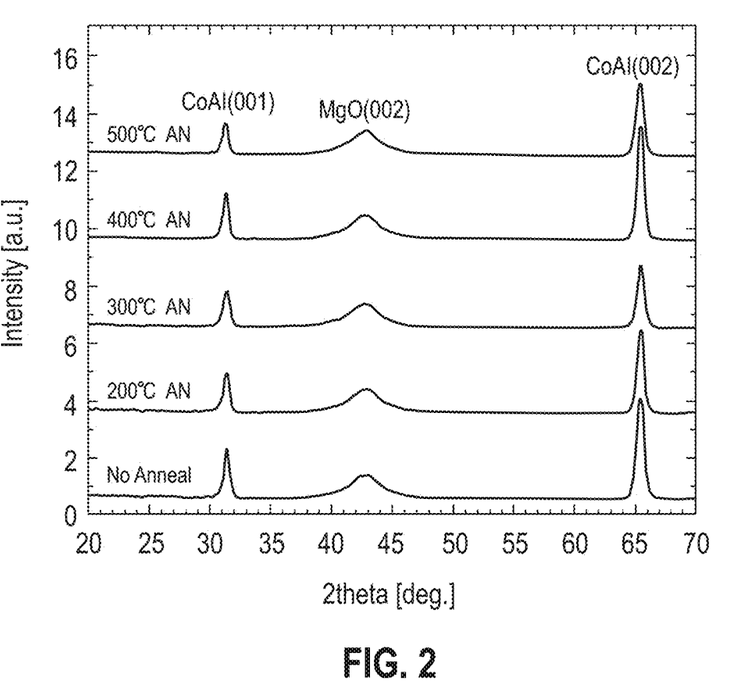
FIG. 2. XRD scans of 300 Å thick $Co_{100-x}Al_x$ films on a MgO/MgO(001) substrate. CoAl films were deposited at room temperature and annealed in situ at various temperatures in vacuum.

X-ray diffraction (XRD) θ-2θ scans were performed on these films. FIG. 2 shows sets of XRD scans of CoAl films annealed at various $T_{AN}$ for 30 minutes (200° C., 300° C., 400° C., 500° C.). These CoAl films were deposited from a single CoAl alloy target. The data were compared with those taken from a CoAl film which was not annealed. The data show the main CoAl (002) peak at 2θ=~65.5° as well as the CoAl (001) peak at 2θ=~31.4°. The existence of the CoAl (001) superlattice peak clearly proves that there is an alternate layering of Co and Al for all annealing temperatures, even without any annealing. However, we find that as-deposited CoAl films grown by co-sputtering from individual targets of Co and Al do not show the CoAl(001) superlattice peak. These films, upon annealing at 400° C. for 30 minutes, form the layered structure. The x-ray diffraction associated with the substrate was observed for all samples and is labeled as the MgO(002) peak. The lattice parameter of the CoAl film is ~2.86 Å, which is close to that of bulk CoAl in B2 structure.

Figure 3:
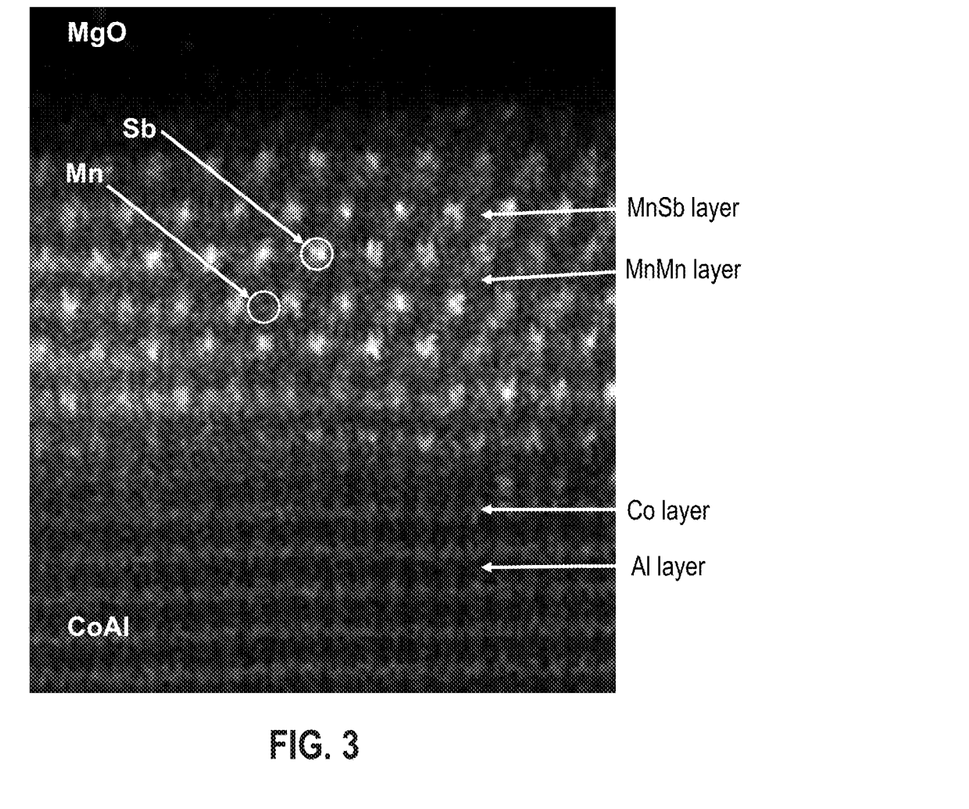
FIG. 3. High resolution TEM image of 20 Å thick $Mn_3Sb$ films on a CoAl templating layer grown on a MgO(001) single crystal substrate.

FIG. 3 is a high resolution transmission electron microscopy (HR-TEM) of a typical 20 Å $Mn_3Sb$ layer grown on a CoAl templating layer. The stack of this sample was MgO (001)/20 Å MgO/300 Å CoAl/20 Å $Mn_3Sb$/20 Å MgO/30 Å Ta. The CoAl templating layer consists of alternating layers of Co and Al in agreement with the XRD measurements detailed in FIG. 2. Excellent epitaxial matching of 20 Å thick $Mn_3Sb$ layers with the CoAl templating layer is clearly seen. Furthermore, the chemical ordering within the Heusler layer is evident: The Mn—Sb layers are easily distinguishable from the Mn—Mn layers, showing the alternating atomic layers and even the chemical ordering within each Mn—Sb layer.

Figure 4:
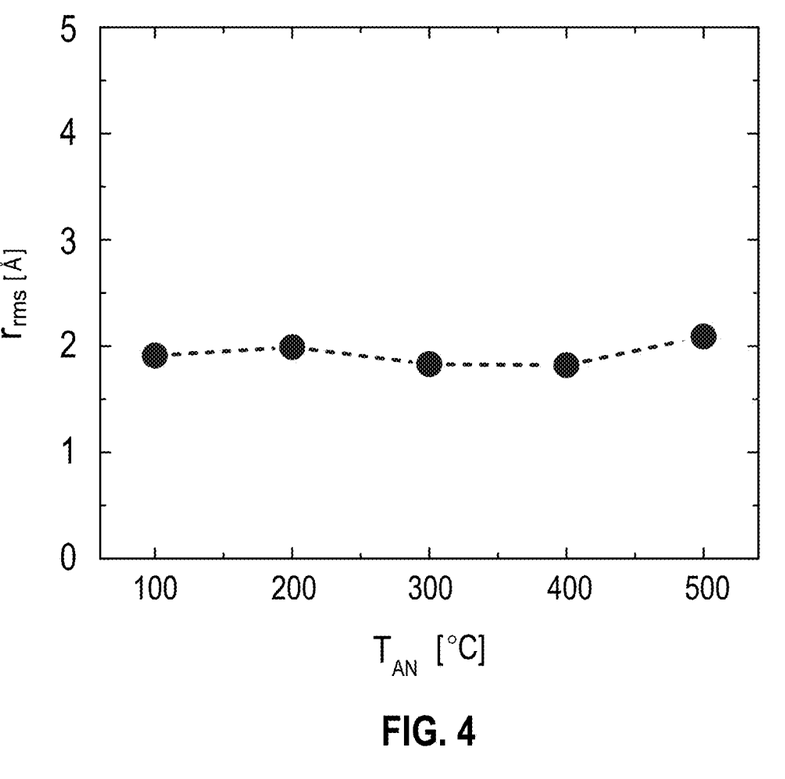
FIG. 4. Root mean square (RMS) roughness ($r_{rms}$) versus annealing temperature of a CoAl templating layer.

Atomic force microscopy was performed to probe the surface morphology of 300 Å thick CoAl templating layers. FIG. 4 shows root-mean-squared surface roughness ($r_{rms}$) for various annealing temperatures. The films show a very smooth surface independent of annealing temperature, with $r_{rms}$<2 Å, which is smoother than the other seed layers attempted (CoGa, CoSn, and CoGe).

$Mn_3Z$ Tetragonal Heusler

Figure 5:
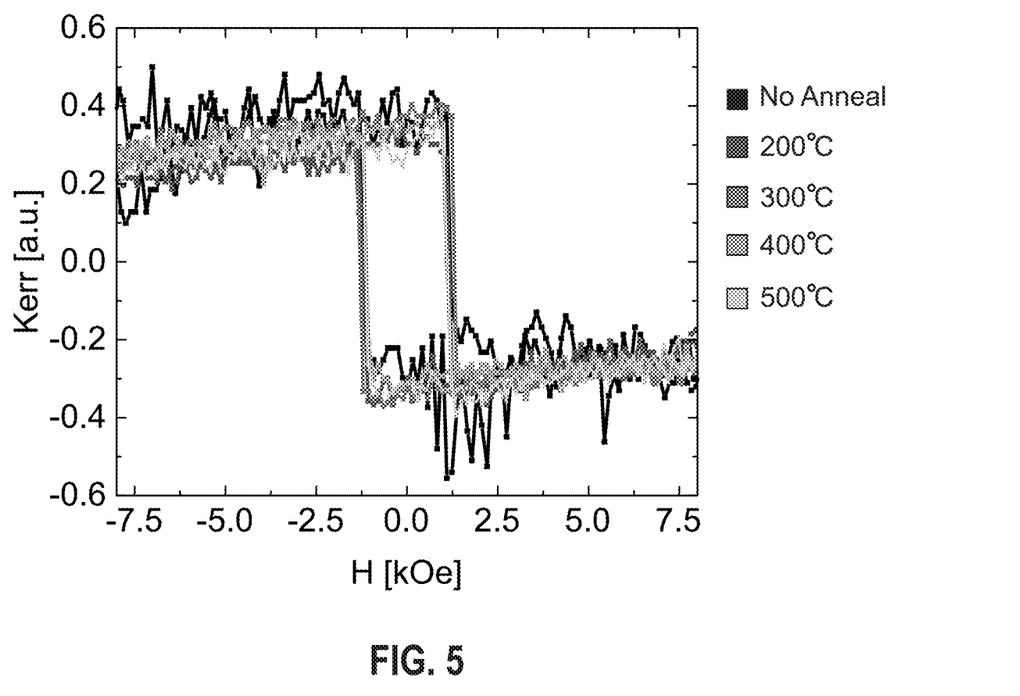
FIG. 5. Perpendicular magneto-optical Kerr effect (P-MOKE) hysteresis loops of 20 Å thick $Mn_3Ge$ films on a 300 Å CoAl templating layer. The CoAl layer was annealed at various temperatures prior to the deposition of $Mn_3Ge$, which was carried out at 100° C.
Figure 6:
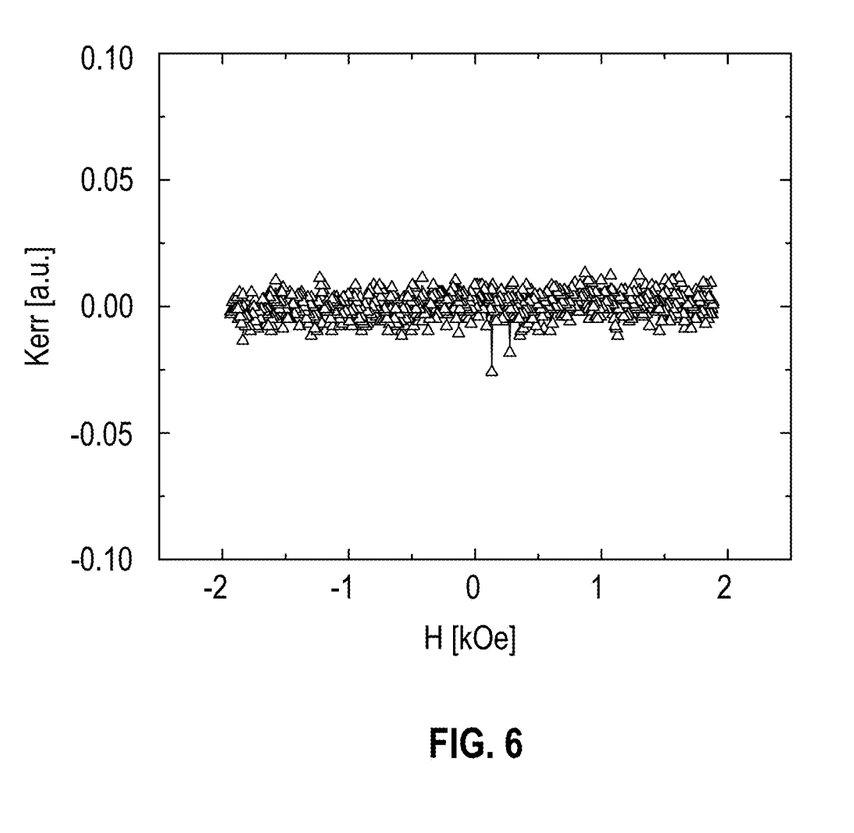
FIG. 6. Perpendicular MOKE signal from a CoAl templating layer grown on a MgO(001) single crystalline substrate.

20 Å-thick $Mn_3Ge$ films were deposited at 100° C. by ion beam deposition on a CoAl templating layer. The stacks were capped by 20 Å thick MgO and 30 Å thick Ta to prevent ambient oxidation of the Heusler layer. The resulting structures are of the form MgO(001)/20 Å MgO/300 Å CoAl/20 Å $Mn_3Ge$/20 Å MgO/30 Å Ta (see FIG. 5; excellent performance was obtained even with CoAl layers having thicknesses of 20 Å, 50 Å, 100 Å, and 200 Å.). The CoAl layers were deposited at room temperature and then annealed at various temperatures (200° C., 300° C., 400° C., 500° C.) for 30 minutes prior to $Mn_3Ge$ deposition. FIG. 5 shows the perpendicular magneto-optical Kerr effect (P-MOKE) hysteresis loops of $Mn_3Ge$ for different annealing temperatures of the CoAl templating layer. Interestingly, the magnetic properties of Mn$_3$Ge are independent of the annealing temperature. Excellent PMA is found for the films using a CoAl templating layer with a squareness of ~1 even for the film that was not annealed. Abrupt switching of the magnetic moment implies that there is no second phase. FIG. 6 shows the P-MOKE signal from a MgO(001)/20 Å MgO/300 Å CoAl/20 Å MgO/30 Å Ta sample that was annealed at 400° C. for 30 minutes. The lack of any magnetic field-dependent MOKE signal clearly indicates that the CoAl templating layer is non-magnetic.

Figure 7:
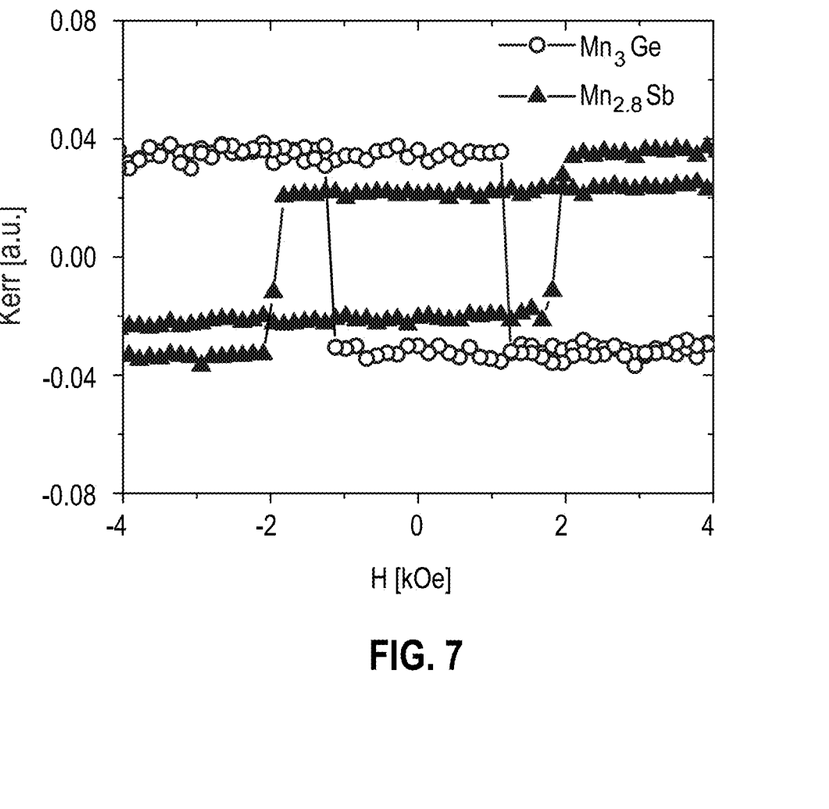
FIG. 7. P-MOKE hysteresis loops of 20 Å thick $Mn_{2.8}Sb$ and $Mn_3Ge$ films on a CoAl templating layer grown on a MgO(001) single crystalline substrate.

The structural ordering of ultrathin layers is likely due to the distinct chemical properties of the elements Co and Al in the templating layer. As an alternative to Al, Al alloys such as AlSn, AlGe, AlGaGe, AlGaSn, AlGeSn, and AlGaGeSn may be employed. Binary (X=Y) and ternary Heusler alloys consist of two or three different types of atoms, respectively. In X$_2$YZ Heuslers, the Z main group element typically has high chemical affinity for X and Y. In this context, the formation of a chemically ordered structure should take place, irrespective of the choice of Z. FIG. 7 shows the case of Mn$_3$Z Heusler compounds for Z=Sb and Ge. 20 Å thick Mn$_3$Z films were deposited at room temperature on CoAl templating layers (which had been annealed at 400° C. for 30 minutes). The sample structures are of the form MgO (001)/20 Å MgO/300 Å CoAl/20 Å Mn$_3$Z (Z=Ge, Sb)/20 Å MgO/30 Å Ta. Excellent PMA was observed in all cases with squareness ~1, but the highest coercivity ~2 kOe is found for the Mn$_{2.8}$Sb film. The polarity of the Kerr signal for Mn$_3$Sb is opposite that of the Mn$_3$Ge Heusler alloys.

Mn$_3$Z Heusler Alloy on Amorphous Substrate

Figure 9:
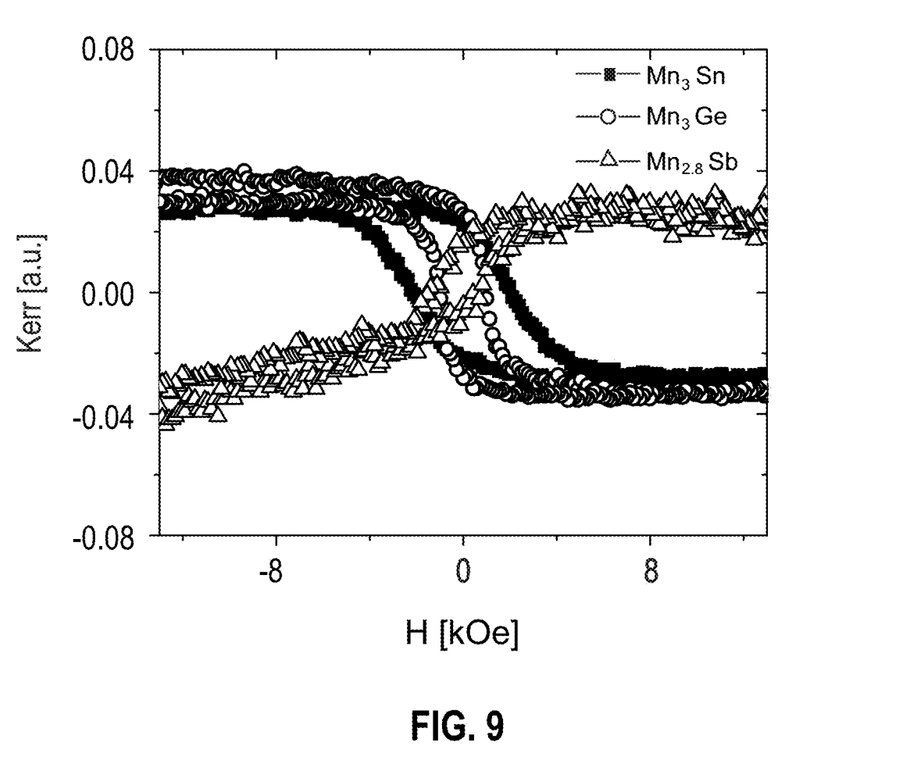
FIG. 9. P-MOKE hysteresis loops for $Mn_3Z$ Heusler films deposited on a CoAl templating layer grown on an amorphous substrate (Si(001)/250 Å $SiO_2$).

A CoAl templating layer is capable of inducing chemical ordering in ultra-thin Heusler films even when they are deposited on amorphous Si/SiO$_2$ substrates at room temperature. FIG. 8 shows the details of a stack grown on a Si(001) substrate having a 250 Å amorphous layer of SiO$_2$. The stack consists of Si(001)/250 Å SiO$_2$/50 Å Ta/3 Å CoFeB/30 Å MgO/50 Å CoAl (annealed at 400° C.)/20 Å Mn$_3$Z/20 Å MgO/20 Å Ta. (All the layers up to and including CoAl were deposited at room temperature and then annealed at 400° C. for 30 minutes.) FIG. 9 shows the P-MOKE hysteresis loops obtained for the structure shown in FIG. 8, for Heusler alloys with Z=Sn, Ge, and Sb. These hysteresis loops, though not sharp, indicate the presence of remanent magnetization in the three cases studied here. Moreover, consistent with our previous observations, the polarity of the Kerr signal for Mn$_{2.8}$Sb is opposite that seen for the Mn$_3$Ge and Mn$_3$Sn Heusler alloys.

Mn$_{2.5}$Sb L1$_0$ Tetragonal Compound on Amorphous Substrates

Figure 10:
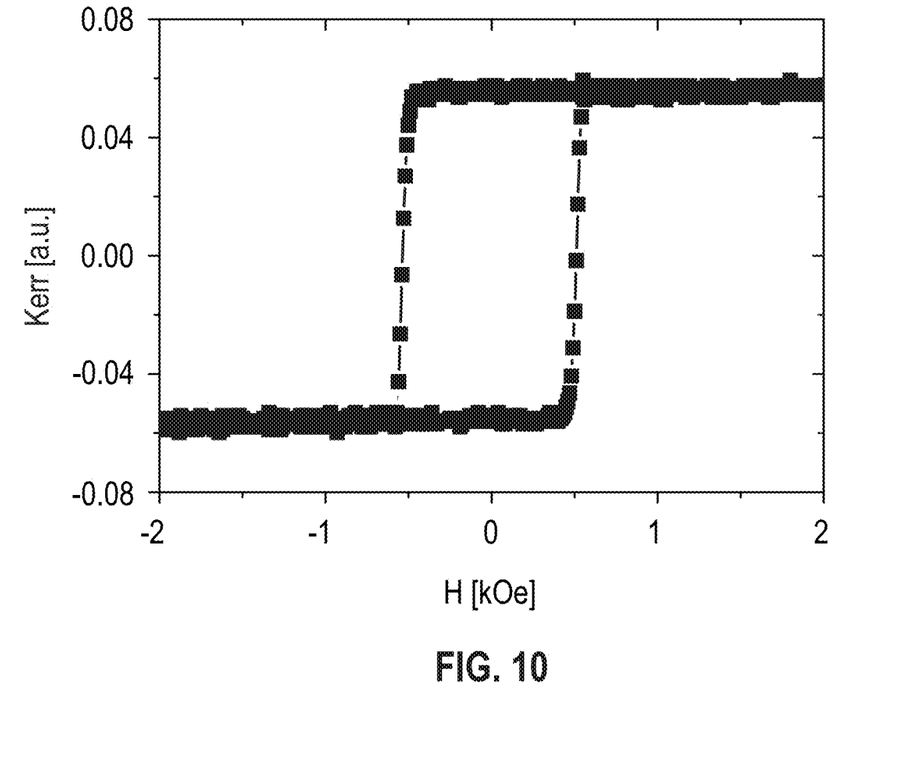
FIG. 10. P-MOKE loop for 20 Å thick $L1_0$ $Mn_{2.5}Sb$ films for a CoAl templating layer grown on an amorphous substrate (Si(001)/250 Å $SiO_2$).

20 Å thick Mn$_{2.5}$Sb films were also deposited on CoAl layer at room temperature using dc-magnetron sputtering, and the films were capped by 20 Å thick MgO and 20 Å thick Ta for structural and magnetic property measurements. The final stack is Si(001)/250 Å SiO$_2$/50 Å Ta/3 Å CoFeB/ 30 Å MgO/50 Å CoAl (annealed at 400° C.)/20 Å Mn$_{2.5}$Sb/ 20 Å MgO/20 Å Ta. (That is, all the layers up to and including CoAl were deposited at room temperature and then annealed at 400° C. for 30 minutes. See FIG. 8 for an analogous structure that employs Mn$_3$Sb.) The Mn$_{2.5}$Sb layer and the capping layers were subsequently deposited after cooling the samples to 100° C. FIG. 10 includes the P-MOKE hysteresis loops from this sample which shows excellent PMA with a squareness of ~1. The AFM measurements indicate a very smooth sample with $r_{rms}$ of ~2 Å. These results demonstrate that the CoAl templating layer is capable of inducing excellent PMA in Heusler and L1$_0$ compounds on amorphous substrates without any need for additional annealing. The CoAl templating layer is effective in inducing ordering within the L1$_0$ compounds, whose constituent elements include one transition metal element and a main group element. Other candidate L1$_0$ compounds include MnAl alloys, MnGa alloys, MnSn alloys, MnGe alloys, and FeAl alloys.

Applications

Figure 11:
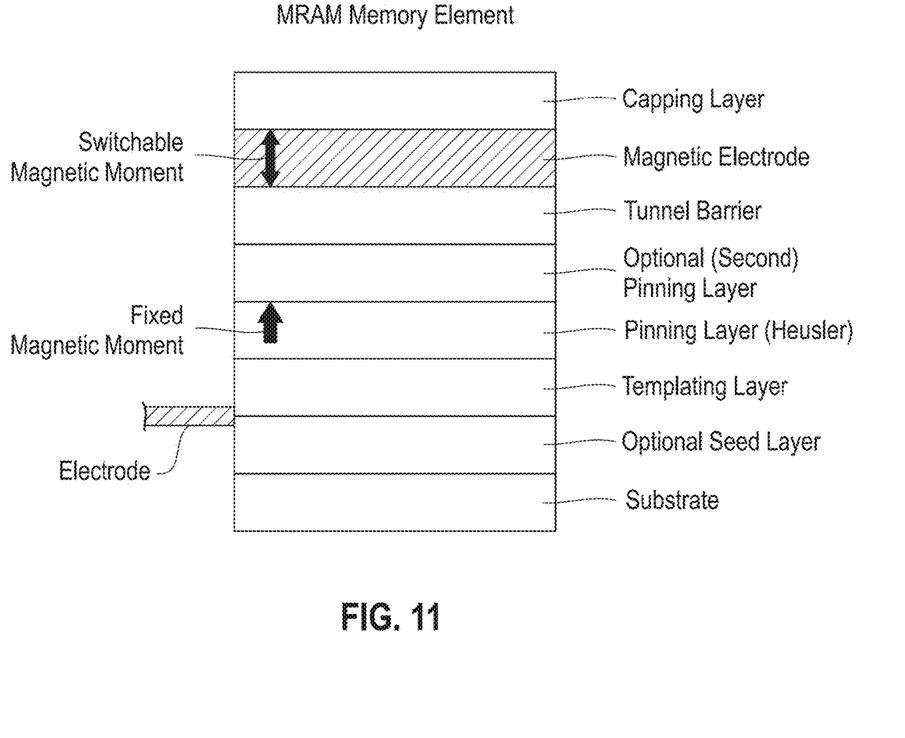
FIG. 11 illustrates a magnetic tunnel junction device that incorporates the templating and Heusler layers described herein.

The structures described herein lend themselves to a variety of applications, including MRAM elements and a racetrack memory device, such as that described in U.S. Pat. No. 6,834,005, issued Dec. 21, 2004 and titled "Shiftable magnetic shift register and method of using the same," which is hereby incorporated herein. One such MRAM element is shown in FIG. 11. As with MRAM elements generally, a tunnel barrier is situated between two magnetic electrodes, one of which has a fixed magnetic moment and the other of which has a magnetic moment that is switchable, thereby permitting the recording and erasing of data. Unlike MRAM elements of the prior art, however, the magnetic layer of FIG. 11 having the fixed magnetic moment (pinning layer) comprises Heusler films such as those described herein. An optional (second) pinning layer may be advantageously employed for even better performance, as described below.

Note that in FIG. 11, the pinning layer (Heusler layer, which may be either ferro- or ferri-magnetic) overlies a seed layer which in turn overlies a substrate. As described herein, the respective compositions of the seed layer and the substrate may be advantageously chosen to promote growth of the Heusler layer, whose magnetic moment is aligned perpendicular to the layer plane.

The templating layer of FIG. 11 is, as described previously herein, a multi-layered structure that is non-magnetic at room temperature, and which comprises alternating layers of Co and at least one other element E (preferably Al; or Al alloyed with Ga, Ge, Sn or any combination thereof, such as AlSn, AlGe, AlGaGe, AlGaSn, AlGeSn, and AlGaGeSn). The composition of this structure is represented by Co$_{1-x}$E$_x$ with x being in the range from 0.45 to 0.55. Overlying the templating layer is a magnetic layer that includes a Heusler compound, e.g., Mn$_3$Ge, Mn$_3$Sn, or Mn$_3$Sb. (Alternatively, overlying the templating layer is a magnetic layer that includes a L1$_0$ compound, such as one or more alloys selected from the group consisting of MnAl, MnGa, MnSn, MnGe, and FeAl.) An optional, second pinning layer may be used to increase performance, and may include Fe, a CoFe alloy, or Co$_2$MnSi.

The tunnel barrier is preferably MgO (001), although other (001)-oriented tunnel barriers may be used, such as CaO and LiF. Alternatively, MgAl$_2$O$_4$ can be used as the tunnel barrier; its lattice spacing can be selected by choosing a Mg—Al composition that leads to good lattice matching with the underlying Heusler or L1$_0$ compound. The magnetic electrode overlying the tunnel barrier may comprise Fe, a CoFe alloy, or a CoFeB alloy, for example. The capping layer may comprise Mo, W, Ta, Ru, or a combination thereof. Current may be induced by applying a voltage between the two magnetic electrodes, which are separated by the tunnel barrier.

Certain structures described herein may also be used in racetrack memory devices. In this case, the racetrack is a nanowire that may include a substrate, an optional seed layer, a templating layer, and a first magnetic layer of a Heusler compound. (See the discussion above with respect to FIG. 11 for possible compositions of these layers. Note that in a racetrack memory device the tunnel barrier and the switchable magnetic layer shown in FIG. 11 would not normally be present; however, in this case the first magnetic layer shown in FIG. 11 would have a magnetic moment that is switchable rather than fixed.) Magnetic domain walls may be moved along this racetrack, as described in U.S. Pat. No. 6,834,005. Data may be read out of (and stored in) the racetrack by interrogating (or changing) the orientation of the magnetic moment of the magnetic material between adjacent domain walls within the racetrack.

The various layers described herein may be deposited through any one or more of a number of methods, including magnetron sputtering, electrodeposition, ion beam sputtering, atomic layer deposition, chemical vapor deposition, and thermal evaporation.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

The invention claimed is:

1. A device, comprising:
    a multi-layered structure that is non-magnetic at room temperature, the structure comprising alternating layers of Co and E, wherein E comprises at least one other element that includes Al, wherein the composition of the structure is represented by $Co_{1-x}E_x$, with x being in the range from 0.45 to 0.55; and
    a first magnetic layer that includes a Heusler compound, the magnetic layer being in contact with the structure.

2. The device of claim 1, wherein the magnetic moment of the magnetic layer is substantially perpendicular to the interface between the structure and the magnetic layer.

3. The device of claim 2, wherein the magnetic layer has a thickness of less than 5 nm.

4. The device of claim 2, wherein the magnetic layer has a thickness of less than 3 nm.

5. The device of claim 2, wherein the magnetic layer has a thickness of one unit cell.

6. The device of claim 1, wherein the Heusler compound is selected from the group consisting of $Mn_{3.1-x}Ge$, $Mn_{3.1-x}Sn$, and $Mn_{3.1-x}Sb$, with x being in the range from 0 to 1.1.

7. The device of claim 1, wherein the Heusler compound is a ternary Heusler.

8. The device of claim 7, wherein the ternary Heusler is $Mn_{3.1-x}Co_{1.1-y}Sn$, wherein $x \leq 1.2$ and $y \leq 1.0$.

9. The device of claim 1, wherein E is an AlGe alloy.

10. The device of claim 1, wherein E is an AlGa alloy.

11. The device of claim 1, wherein E includes an alloy selected from the group consisting of AlSn, AlGe, AlGaGe, AlGaSn, AlGeSn, and AlGaGeSn.

12. The device of claim 1, comprising a substrate underlying the multi-layered structure.

13. The device of claim 12, comprising a tunnel barrier overlying the first magnetic layer, thereby permitting current to pass through both the tunnel barrier and the first magnetic layer.

14. The device of claim 13, comprising a second magnetic layer in contact with the tunnel barrier.

15. The device of claim 14, wherein the tunnel barrier includes Mg and O.

16. A method, comprising:
    using the device of claim 14 as a memory element.

17. The method of claim 16, wherein the memory element is a racetrack memory device.

18. A method of forming the device of claim 1, comprising:
    depositing Co and Al, thereby forming a composite layer on a substrate;
    annealing the composite layer, so that at least one layer of Co and at least one layer of Al are formed from the composite layer, thereby forming the multi-layered structure; and
    depositing the magnetic layer over the multi-layered structure.

19. The method of claim 18, wherein the annealing takes place at a temperature of at least 400° C.

20. The method of claim 18, wherein the substrate is MgO.

21. A device, comprising:
    a substrate;
    a multi-layered structure that is non-magnetic at room temperature, the structure comprising alternating layers of Co and E, wherein E comprises at least one other element that includes Al, wherein the composition of the structure is represented by $Co_{1-x}E_x$, with x being in the range from 0.45 to 0.55, wherein the structure overlies the substrate;
    a first magnetic layer that includes a Heusler compound, the magnetic layer being in contact with the structure;
    a tunnel barrier overlying the first magnetic layer; and
    a second magnetic layer in contact with the tunnel barrier, wherein the second magnetic layer has a magnetic moment that is switchable.

22. The device of claim 21, comprising a capping layer in contact with the second magnetic layer.

23. The device of claim 21, wherein the first magnetic layer includes Mn and an element selected from the group consisting of Sn, Sb, and Ge.

24. The device of claim 23, wherein the first magnetic layer further includes Co.

25. A device, comprising:
    a multi-layered structure that is non-magnetic at room temperature, the structure comprising alternating layers of Co and E, wherein E comprises at least one other element that includes Al, wherein the composition of the structure is represented by $Co_{1-x}E_x$, with x being in the range from 0.45 to 0.55; and
    a first magnetic layer that includes an $L1_0$ compound, the magnetic layer being in contact with the structure.

26. The device of claim 25, wherein the magnetic moment of the magnetic layer is substantially perpendicular to the interface between the structure and the magnetic layer.

27. The device of claim 25, wherein the $L1_0$ compound is selected from the group consisting of MnGa, MnAl, FeAl, MnGe, MnSb, and MnSn alloys.

28. A method, comprising using the device of claim 25 as a memory element.

29. The method of claim 28, wherein the memory element is a racetrack memory device.

* * * * *